(12) United States Patent
Chen et al.

(10) Patent No.: US 11,586,496 B2
(45) Date of Patent: Feb. 21, 2023

(54) ELECTRONIC CIRCUIT WITH INTEGRATED SEU MONITOR

(71) Applicant: IHP GmbH-Innovations for High Performance Microelectronics / Leibniz-Institut für innovative Mikroelektronik, Frankfurt (DE)

(72) Inventors: Junchao Chen, Frankfurt (DE); Milos Krstic, Frankfurt (DE); Marko Andjelkovic, Frankfurt (DE); Aleksandar Simevski, Frankfurt (DE)

(*) Notice: Subject to any disclaimer, the term of this patent is extended or adjusted under 35 U.S.C. 154(b) by 120 days.

(21) Appl. No.: 16/893,753

(22) Filed: Jun. 5, 2020

(65) Prior Publication Data
US 2020/0387423 A1 Dec. 10, 2020

(30) Foreign Application Priority Data
Jun. 7, 2019 (EP) .................................... 19179081

(51) Int. Cl.
*G06F 11/10* (2006.01)
*B64G 1/66* (2006.01)
*G11C 11/412* (2006.01)
*G11C 11/417* (2006.01)

(52) U.S. Cl.
CPC .............. *G06F 11/106* (2013.01); *B64G 1/66* (2013.01); *G11C 11/412* (2013.01); *G11C 11/417* (2013.01)

(58) Field of Classification Search
CPC ....... G06F 11/106; B64G 1/66; G11C 11/412; G11C 11/417; G11C 29/52; G11C 11/4125; G11C 5/005
See application file for complete search history.

(56) References Cited

U.S. PATENT DOCUMENTS

| | | | |
|---|---|---|---|
| 2007/0176627 A1 | 8/2007 | Ng et al. | |
| 2009/0177932 A1 | 7/2009 | Abts et al. | |
| 2012/0072786 A1* | 3/2012 | Bahali | G06F 11/076 714/704 |
| 2012/0246544 A1* | 9/2012 | Resnick | G11C 29/44 714/764 |
| 2014/0317460 A1* | 10/2014 | Kleveland | G11C 29/42 714/710 |

(Continued)

OTHER PUBLICATIONS

Extended Search Report for European Patent Application No. 19179081.5, dated Jan. 3, 2020, 9 pages.

(Continued)

*Primary Examiner* — Thien Nguyen
(74) *Attorney, Agent, or Firm* — Sheridan Ross

(57) ABSTRACT

An electronic circuit comprising an SRAM memory, a control unit, an error detection and correction module and a scrubbing module. The electronic circuit further comprises an integrated SEU monitor of the SRAM memory. The SEU monitor does not use standalone or specialized SRAM memories or particle detectors. Rather, the same SRAM memory that is used for the main operation as a storage element of the electronic circuit serves simultaneously as detector for the SEU monitor. The proposed SEU monitor enables real-time monitoring of the SEU rate in order to detect early the high radiation levels and apply appropriate hardening measures. Furthermore, a method for monitoring an SEU rate and determining permanent faults in an electronic circuit is suggested.

7 Claims, 4 Drawing Sheets

(56) References Cited

U.S. PATENT DOCUMENTS

| | | | |
|---|---|---|---|
| 2015/0318058 A1 | 11/2015 | Curley et al. | |
| 2017/0139641 A1* | 5/2017 | Cha | G06F 11/106 |
| 2018/0003559 A1* | 1/2018 | Smith | G01J 1/44 |
| 2018/0246794 A1* | 8/2018 | Baty | G06F 11/0727 |
| 2019/0073261 A1* | 3/2019 | Halbert | G11C 29/52 |

OTHER PUBLICATIONS

"Functional safety of electrical/electronic/programmable electronic safety-related systems," The International Electrotechnical Commission (IEC), 2005, Part O; Functional safety and IEC 61508, 38 pages.

Barak et al. "Detecting Heavy Ions and Protons in Space: Single-Events Monitor," Eighteenth Convention of Electrical and Electronics Engineers in Israel, Tel Aviv, 1995, 5.5.1, 3 pages.

Glein et al. "BRAM Implementation of a Single-Event Upset Sensor for Adaptive Single-Event Effect Mitigation in Reconfigurable FPGAs," IEEE, 2017 NASA/ESA Conference on Adaptive Hardware and Systems (AHS), 2017, 8 pages.

Hsiao "A Class of Optimal Minimum Odd-weight-column SEC-DED Codes," IBM Journal of Research and Development, Jul. 1970, vol. 14, No. 4, pp. 395-401.

Prinzie et al. "An SRAM Based Radiation Monitor with Dynamic Voltage Control in 0.18 µm CMOS technology," Topical Workshop on Electronics for Particle Physics, 2018, 8 pages.

Simevski et al. "Investigating core-level N-modular redundancy in multiprocessors," IEEE, 2014 IEEE 8th International Symposium on Embedded Multicore/Manycore SoCs, 2014, pp. 175-180.

Tsiligiannis et al. "An SRAM Based Monitor for Mixed-Field Radiation Environments," IEEE Transactions on Nuclear Science, Aug. 2014, vol. 61, No. 4, pp. 1663-1670.

* cited by examiner ized particles, including for example charged particles

ELECTRONIC CIRCUIT WITH INTEGRATED SEU MONITOR

CROSS-REFERENCE TO RELATED APPLICATION

This application claims the benefit of European Patent Application No. 19 179 081.5 filed 7 Jun. 2019, the entire contents of which are incorporated herein by reference in its entirety.

FIELD

The present disclosure relates to an electronic circuit comprising an integrated monitor for Single-Event Upsets (SEU). The present disclosure also relates to a multiprocessor system including an electronic circuit according to a first aspect of the present disclosure. Furthermore, a method for monitoring an SEU rate and determining permanent faults in an electronic circuit is suggested.

BACKGROUND

All electronic circuits in space are subject to Single Event Effects (SEE) which are caused by high energy radiation of ionizing particles, including for example charged particles or γ-particles that influence electronic systems. In space born systems often such radiation cannot be completely shielded. Since SEEs have a significantly lower frequency with respect to the frequency of their occurrence in comparison with a clock frequency of integrated circuits, they are therefore regarded as individual events and not as simultaneous multiple occurrences. In case an SEE occurs, it is possible to undesirably switch a stored bit state, which is known as a Single Event Upset (SEU).

SEUs are one of the major concerns in the design of modern nanoscale CMOS integrated circuits for space applications. The SEU is a transient fault in storage components caused by an energetic particle (e.g. neutron, proton, heavy iron or alpha particle) that passes through the sensitive region within an off-state transistor. The passage of the energetic particle results in charge deposition. The primary condition for an SEU occurrence is that the deposited charge exceeds a critical charge of the impacted element, e.g. a memory cell. The critical charge of the element corresponds to the minimum electric charge disturbance needed to change a logic level. E.g. a bit stored in a memory cell may change from 0 to 1 if a high-energy particle impacts on the memory cell. This kind of error is also called "soft error". The rate of occurrence of soft errors is denoted as "soft error rate" (SER). A higher critical charge means fewer soft errors because the number of high-energy particles decreases as a function of their energy which is directly linked with the amount of charge deposited by the particle. The critical charge increases with the size of the circuit elements. Bigger circuit elements normally have a higher electric capacitance and, therefore, need bigger electric charges to control their state. Hence, a higher critical charge also means a slower logic gate and a higher power dissipation. Conversely, a reduction in chip feature size and supply voltage, desirable for many reasons, decreases the critical charge which entails an increased probability of SEUs. Thus, the importance of soft errors increases as chip technology advances towards smaller chip feature structures.

Generally, SEUs may be caused either when a high-energy particle strikes a memory element directly, or when a particle-introduced glitch in the logic circuit, also known as Single Event Transient (SET) propagates through the circuit and is finally stored in a memory element. Regardless of their origin, these errors influence electronic systems and can cause problems ranging from data corruption to hardware malfunctions. For these reasons these errors must be mitigated or compensated to achieve reliable operation of the electronic system. Protective measures against SEUs include error correcting codes or radiation hardened design of electronic circuits, such as Triple-Modular-Redundancy (TMR) design. The downside of these protective measures is that they increase resource usage including chip area and power consumption.

Galactic cosmic rays (GCRs) and Solar Particle Events (SPEs) have a very variable intensity, i.e. the number of SEUs varies a lot. For instance, under background radiation the SEU rate for Static Random Access Memories (SRAMs) is $10^{-8}$ upsets/bit/day, while the SEU rate can rise up to $10^{-6}$ upsets/bit/day or even higher during an SPE. Since a high radiation level can last for hours or even days it is vital to employ real-time monitoring of the SEU rate in order to detect early the high radiation levels and apply appropriate hardening measures. For example, the electronic circuits can be operated at different levels of redundancy depending on the instantaneous SEU rate to make the best use of the available resources of the electronic circuit. However, for extended periods of time under background radiation a high level of redundancy is not required and is therefore a waste of resources.

Conventionally, SEU rate monitoring is accomplished by using specialized SEU monitors employing standalone SEU monitors which are realized as separate functional elements (either discrete or integrated). The two most common solutions are based on radiation sensitive elements such as SRAMs or pixel detectors. However, these conventional SEU monitors have common shortcomings: Firstly, standalone monitors are often not realized in the same technology as a main system, thus making data processing more challenging. Secondly, a use of standalone monitors often increases the overall cost, area and power consumption of the electronic circuit.

One example of a conventional SEU monitor has been described by R. Glein et al. [1]. J. Barak et al. disclose a standalone monitor for space applications [2]. G. Tsiligiannis et al. describe a standalone SRAM based SEU monitor for CERN particle accelerator [3] and Prinzie et al. propose a standalone custom SRAM ASIC [4].

In view of the important shortcomings of conventional SEU monitors in terms of high cost and area and/or power overhead, there remains a desire for an SEU monitor that overcomes the before mentioned shortcomings or at least improves some or all of them.

SUMMARY

According to a first aspect of the present disclosure relates to an electronic circuit comprising an SRAM memory, a control unit, an error detection and correction module and a scrubbing module. The electronic circuit further comprises an SEU monitor including SRAM cells of the SRAM memory.

The SEU monitor of the electronic circuit according to the present disclosure enables real-time monitoring of the SEU rate in order to detect early high radiation levels and apply appropriate hardening measures. The high radiation levels can for instance be caused by SPEs. During an SPE, the host of the electronic circuit, such as a microprocessor system, can be operated at different levels of redundancy depending on the instantaneous SEU rate from the electronic circuit, and make the best use of the available resources of the host system. However, for extended periods of time under background radiation a high level of redundancy is not required and is therefore a waste of resources. The SEU monitor does not use standalone or specialized SRAM memories or particle detectors. Rather, the same SRAM memory that is used for the main operation as a storage element of the electronic circuit serves simultaneously as detector for the SEU monitor.

The error correction and detection module is effective to increase the reliability of the electronic device by improving the upset rates of the SRAM memory. The improvement may amount to several orders of magnitude. The scrubbing module performs a data scrubbing which is an error correction technique that uses a background task.

Advantageously, the control unit of the electronic circuit is provided with at least two counters for counting different types of errors including single, double and/or permanent faults. In a specific embodiment there are three counters, in particular, three 8-bit counters. The counters can be read out by the user and, therefore, provide a basis for correctly measuring the SEU rate.

In an advantageous embodiment the control unit comprises a control register containing user selectable control parameters determining the operation of the electronic circuit. By setting the control parameters the user can adjust the functioning of the electronic circuit. The control parameters include e.g. the scrubbing rate.

Advantageously, the error detection and correction module is configured to correct single-bit errors and to detect double-bit errors in each memory word. The occurrence probability of uncorrectable multi-bit errors and the accumulation of transient faults can be significantly reduced if the entire memory is scrubbed regularly including the correction of single-bit errors. The SEU monitor provides an indication of the SER and thus enables to adapt or select an appropriate level of redundancy for a host of the electronic circuit. The host for the electronic circuit is for example a multiprocessor system.

In a further embodiment of the present disclosure the control unit comprises a register file storing addresses of double bit errors and/or permanent faults. The register file makes the addresses of already detected double-bit errors and/or permanent faults available. These types of errors are not correctable and, thus, the register file enables avoiding double counting of already detected errors. Beyond that, the register file contains the addresses of permanent faults and, hence the SEU monitor can detect permanent faults. This is an important advantage because known SEU monitors do not provide this feature. The errors are stored in the register file using a 21-bit entry composed of a valid entry bit, a 19-bit address and an error type bit.

In a further development the at least two counters and the memory for the register file are implemented in a radiation-hardened design. In the above-mentioned specific embodiment three counters, each counter implemented in a radiation-hardened design. The counters and the memory for the register file are essential components for the SEU monitor. Therefore, it is advantageous for increasing the reliability of the entire electronic circuit to protect especially these components against radiation.

In conclusion, the proposed design of the electronic circuit provides a substantial advancement over the previous standalone SEU monitor designs by combining the SEU detection and storage function, such as SRAM-based design. The proposed design also reduces the resource overhead compared to other non-standalone SEU monitor design, such as BRAM-based design for FPGA. Moreover, the proposed design supports the detection of permanent faults in memory arrays, which is to the best knowledge of the inventors not feasible with any of the reported designs. The proposed design can be efficiently implemented with a negligible power/area overhead.

For example, SRAM cells realized in 130 nm technology are more sensitive to particle strikes than other standard cells in the same technology. Therefore, the use of SRAM as an SEU monitor is a valid choice. The synthesis results show that the area and power consumption overheads are negligible compared to the 20-Mbit SRAM.

According to a second aspect of the present disclosure a multiprocessor system comprising an electronic circuit according to the first aspect of the present disclosure is suggested.

The electronic circuit including the proposed SEU monitor is suitable to be used as an integral part of a multiprocessor system in order to achieve a dynamic self-adaptive platform which enables an adaptive trade-off between reliability, power consumption and performance.

According to an advantageous embodiment, the multiprocessor system is configured to be operated in different operating modes implementing different reliability levels. The multiprocessor system automatically adapts to the operating mode in response to an SEU rate measured by the SEU monitor.

By switching between different operating modes, it is achieved to dynamically improve the reliability or to enhance the performance by adjusting a "redundant" and "power off" status of the processing cores. Consequently, the required reliability level is met without wasting resources in terms of power consumption and processing performance of the multiprocessor system.

The use of the SEU monitor is foreseen in a multiprocessor system with reconfigurable/dynamic mechanisms. The optimal operating modes can be dynamically determined according to the real-time SERs and the reliability requirements.

According to a third aspect of the present disclosure, a method for monitoring an SEU rate and determining permanent faults in an electronic circuit according to one of the preceding claims, wherein the method comprises
  scrubbing one memory word at a first memory address;
  detecting the occurrence of an error,
  if no error or has been detected, scrubbing a memory word at a next memory address,
  if an error has been detected, determining whether the error has already been recorded in a register file;
  if the detected error has already been registered the register file, scrubbing a memory word at a next memory address;
  if the detected error has not yet been recorded the register file, re-scrubbing the memory word;
  determining whether the re-scrubbed memory word contains an error; and
  if no error in the re-scrubbed memory word is detected, incrementing a single-bit error counter and scrubbing a memory word at a next memory address;
  if an error in the re-scrubbed memory word is detected, confirming whether the error in the re-scrubbed memory word is a double-bit error;
  if a double-bit error is confirmed, incrementing a double-bit error counter;
  if a double-bit error is not confirmed, incrementing a permanent fault counter;

recording address and error type of double-bit errors and permanent faults in a register file; and scrubbing a memory word at a next memory address.

The proposed method enables real-time monitoring of the SEU rate in order to detect early high radiation levels and apply appropriate hardening measures. For example, electronic circuits in general and in particular multiprocessor systems can be operated at different levels of redundancy depending on the instantaneous SEU rate to make the best use of the available resources of the electronic circuit. Another advantage of the proposed method is its ability to detect permanent faults from the re-scrubbing procedure. Known SEU monitors cannot provide this a functionality.

Advantageously, the method further comprises returning to the first memory address after the data word at the last memory address has been scrubbed. Returning to the first memory address after the last memory address has been scrubbed ensures that SEU cannot accumulate in the SRAM memory and thus secure proper functioning of the electronic circuit.

According to one embodiment, the method further comprises initiating the scrubbing of the memory word at the first memory address if the electronic circuit is idle and/or in regular time intervals. Regularly scrubbing the entire memory reduces the occurrence of uncorrectable multi-bit errors and the accumulation of transient faults.

It has been found useful if the method further comprises comparing a next memory address with memory addresses logged in the register file; and skipping the re-scrubbing of the memory word at the next memory address if the next memory address is already logged in the register file.

Avoiding double counting of already logged errors by skipping a memory address that is already logged in the register file contributes to determine the correct SEU rate. The correct measurement of the SEU rate is important because the operation modes of the electronic circuit are adapted in response to the measured SEU rate.

According to a final aspect the present disclosure suggests a spacecraft comprising an electronic circuit according to the first aspect of the present disclosure and/or a multiprocessor system according to the second aspect of the present disclosure.

BRIEF DESCRIPTION OF DRAWINGS

Exemplary embodiments of the present disclosure are illustrated in the drawings and are explained in more detail in the following description. In the figures, the same or similar elements are referenced with the same or similar reference signs. It shows.

DESCRIPTION OF EMBODIMENTS

Figure 1A:
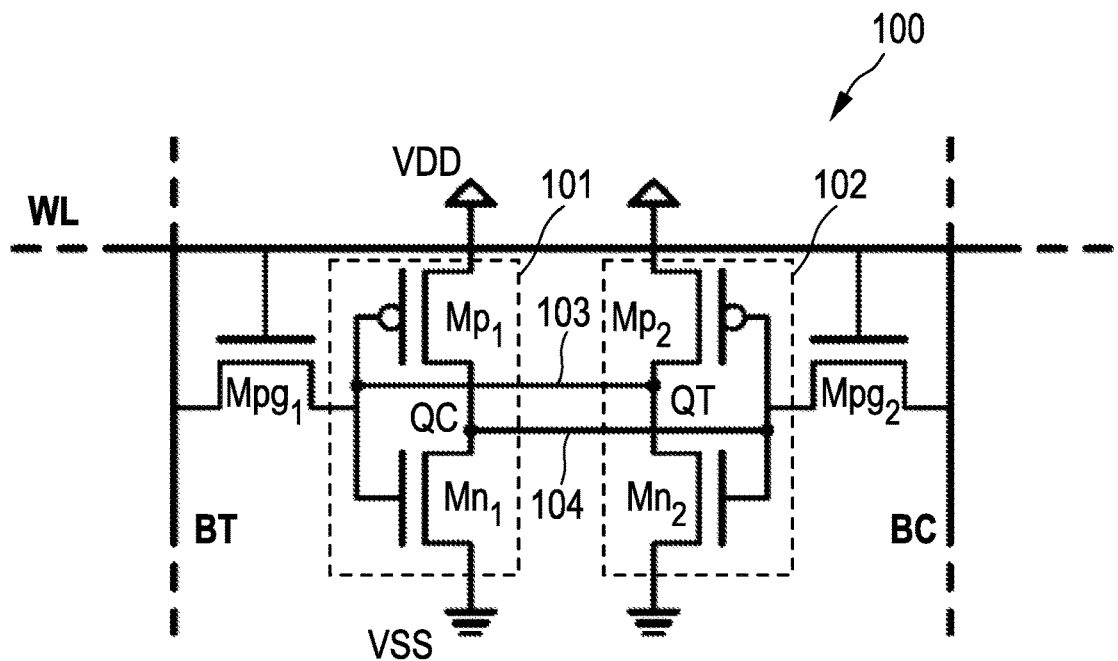
FIG. 1A a block diagram of a 6 transistor (6T) SRAM cell.

FIG. 1A shows a circuit diagram of a six-transistor (6T) SRAM cell 100, which is a frequently used design. The shown 6T-SRAM cell is realized in CMOS technology. The memory element of the cell is a latch implemented by two cross-coupled inverters 101, 102 formed by a pair of PMOS transistor Mp1 and NMOS transistor Mn1 and a pair of PMOS transistor Mp2 and NMOS transistor Mn2, respectively. The coupling between the inverters 101 and 102 are shown by connection lines 103, 104. There are two further NMOS transistors Mpg1 and Mpg2 which control the read and write operations. A word line WL can be switched between a high and a low state. If the word line WL is in the low state, the SRAM cell 100 is insulated from bit lines BC and BT. The inverters 101 and 102 mutually stabilize themselves as long as the supply voltages VDD and VSS are provided. Connection points QT and QC of the connection lines 103, 104 are the most radiation-sensitive nodes within the SRAM cell. If the impact of a high-energy particle deposits a charge exceeding the critical charge an SEU occurs because the critical charge is sufficient to switch the state of the memory cell 100. In comparison to other logic gates, SRAM cells usually exhibit higher sensitivity to radiation and are thus suitable as radiation monitors. In general, the overall sensitivity of the SRAM module is determined by the number of cells, i.e., by the total memory capacity. Due to the relatively low cost, high sensitivity to radiation and the possibility of implementation in different technologies, SRAMs are widely used as SEU monitors. The SEU rate monitoring with SRAMs is based on counting the bit flips in the elementary SRAM cells, where the number of bit flips per unit time represents the SEU rate, which is related to the SER.

Figure 1B:
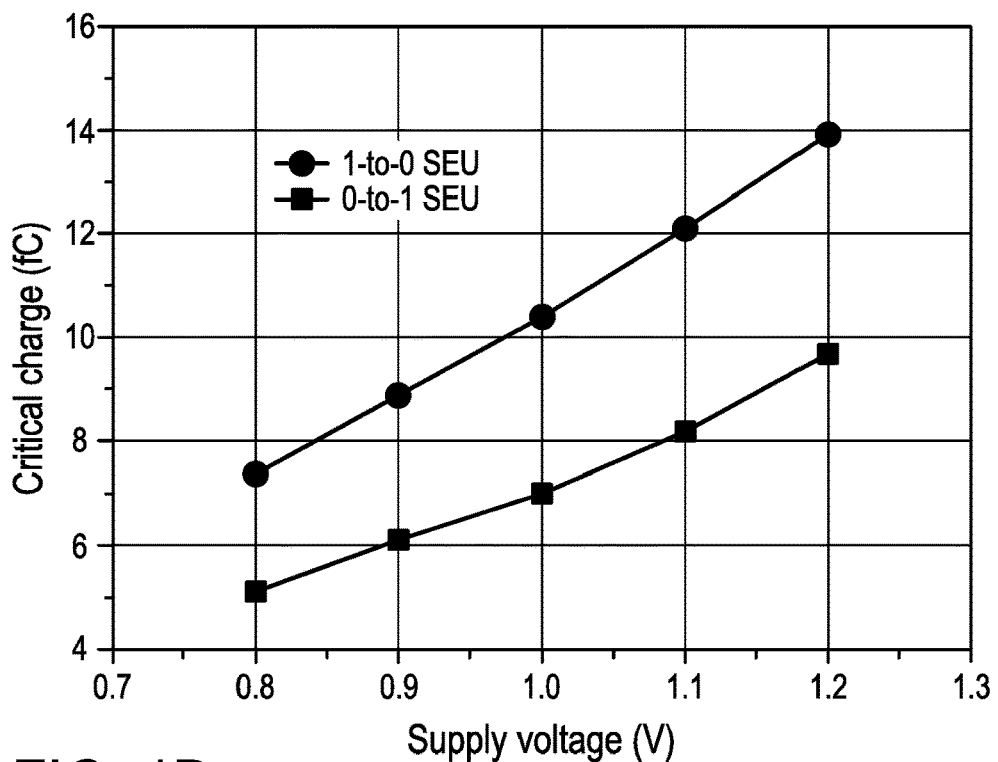
FIG. 1B a diagram displaying a critical charge of the SRAM cell as a function of supply voltage.

Other memory cells including more or fewer transistors are known in the art. But the 6T memory cell is widely used and has therefore been selected to illustrate the present disclosure. Nevertheless, the present disclosure is applicable to other types of memory cells as well and is not limited to the 6T memory cell. FIG. 1B depicts the variation of the critical charge of the SRAM cell 100 as a function of supply voltage, for the cases when a logic '0' and a logic '1' are stored in the cell 100. FIG. 1B shows that the critical charge depends on the stored value, and it decreases as the supply voltage is reduced. The reduction of supply voltage leads to the decrease of the "driving strength" of transistors, consequently reducing the transistors capability to dissipate the charge deposited by a high-energy particle. In general, the critical charge for an SRAM cell tends to be smaller than for logic gates. This fact qualifies SRAM cells as a suitable sensor for an SEU monitor.

Figure 2:
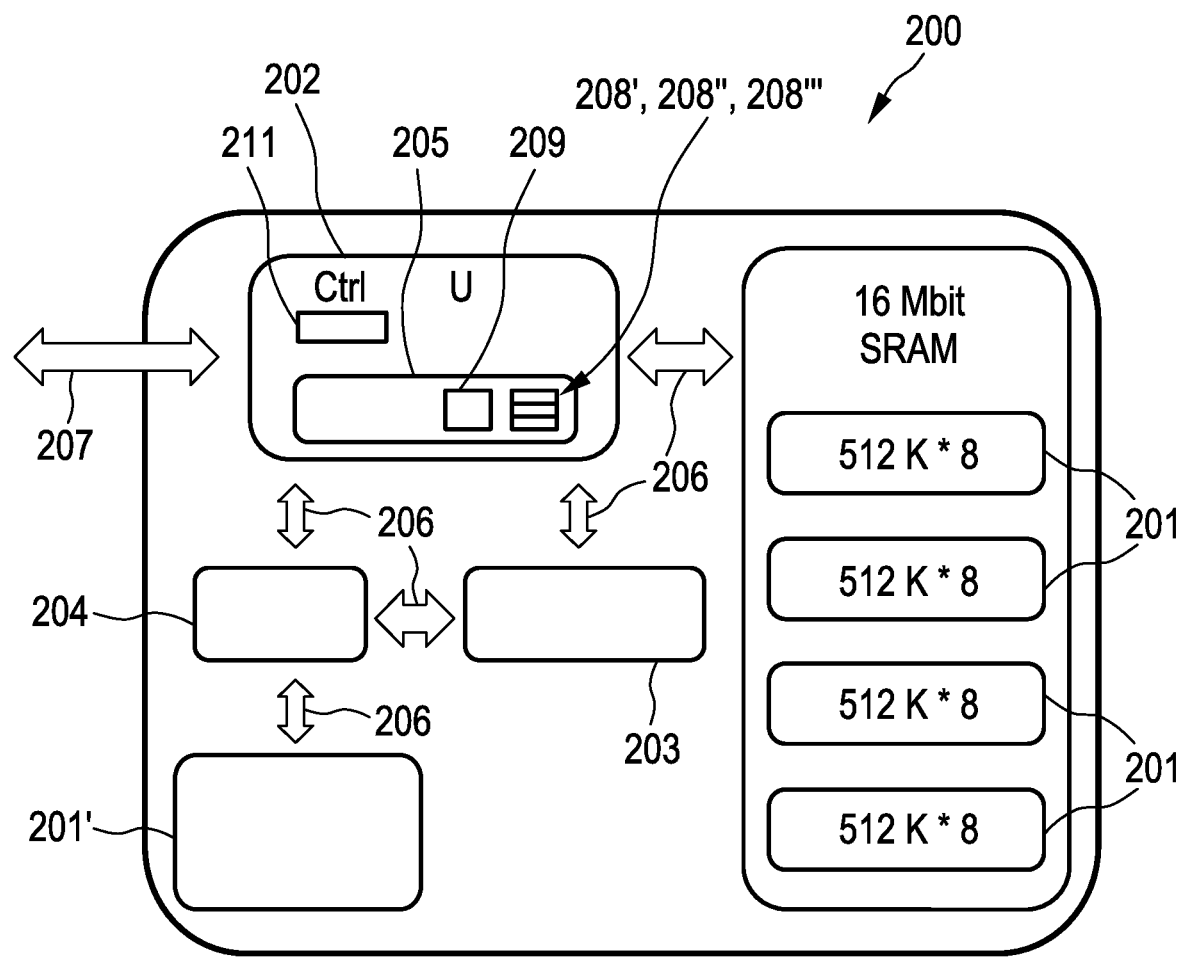
FIG. 2 a block diagram of an SRAM chip with an integrated SEU monitor.

FIG. 2 shows a block diagram of an SRAM chip 200 including an SEU monitor or according to the present disclosure. The SRAM chip comprises five 512K×8-bit asynchronous SRAM memory blocks 201', 201 forming a 20 MBit synchronous SRAM (SSRAM) chip. Furthermore, the chip 200 comprises a control unit 202, a scrubbing module 203 and an error detection and correction (EDAC) module 204. The SRAM memory block 201' is used only internally for the purpose of storing the 7-bit EDAC syndrome computed on each 32-bit write to the rest of the four memory blocks 201. For the user the chip 200 effectively behaves as a 16 Mbit device organized as a 4M×32-bit memory. The memory blocks 201', 201 are based on the conventional memory cell 100 already described above in connection with FIG. 1A. Each read, write or scrubbing cycle uses the EDAC module 204 and involves the access to 32-bit data items selected by a 19-bit address. The EDAC and scrubbing modules 203, 204 are employed to protect the memory cells 100 and hence the memory blocks 201', 201 against SEUs and detect single- and double-bit errors as well as permanent faults in each memory word. Three 8-bit counters 208', 208", 208''' are integrated into the control unit 202 to count single- and double-bit errors, as well as permanent faults individually. Besides, a register file in the control unit 202 is used to record the faults in order to avoid double counting of double-bit errors and permanent faults as it will be explained in greater detail further below. In other embodiments, a plurality of SEU monitors 205 may be integrated into the control unit 202 to enhance the performance of the SEU monitoring process. Obviously, the present disclosure does not depend on the number of SEU monitors 205.

Data communication between memory blocks 201', 201 and modules 202-205 is performed by data connections symbolized by double-headed arrows 206. Data communication with components outside of the chip 200 is performed via an input/output pin 207.

In the following the modules of the chip 200 are described in greater detail.

EDAC Module

In order to detect and correct SEUs in SRAMs, a built-in EDAC module by using a (39,32) HSIAO SEC-DED code is deployed to protect the SRAM content. The HSIAO code is described in IBM Journal of Research and Development, vol. 14, no. 4, July 1970, pp. 395-401 [5] and provides a fast and simple encoding/decoding with low hardware overhead. The EDAC module 204 can improve the upset rates of the SRAM by several orders of magnitude. Thus, a reliable memory device with very high density is provided. On each 32-bit data write, the EDAC module calculates a 7-bit parity syndrome and stores it in the internal 4 Mbit memory block 201'. On each 32-bit data read, the 32-bit data and its corresponding 7-bit syndrome are read and decoded. During read and scrubbing, the EDAC module 204 can detect single- and double-bit errors. In this case, the corresponding error signal and data address are sent to the control unit 202 which has control bits that direct the next actions e.g., raise the error signal on the output pin 207, or, re-write the data with corrected bits in case of a single-bit error.

Scrubbing Module

The scrubbing module 203 performs a data scrubbing which is an error correction technique that uses a background task to periodically inspect memory blocks or storage for errors. Detected errors are corrected using redundant data in the form of different checksums or copies of data. In the present embodiment the above-mentioned (39,32) HSIAO SEC-DED code is applied for this purpose.

The primary role of the scrubbing module 203 is to avoid accumulation of radiation-induced soft errors. In the present embodiment it is further used to drive the SEU monitor 205 and provide additional information. In the SSRAM 200 the scrubbing module 203 periodically reads memory words from the memory blocks 201 when the chip is idle. It automatically increments the next scrubbing address after completing the current scrubbing cycle. The addresses start from 0 to the last $2^{19}-1$ address, after which it starts again from 0. In case of a single-bit error, scrubbing module corrects the error by using the EDAC module 204 and performs a write-back at the same address with corrected data. The scrubbing procedure is entirely autonomous and transparent for the user, which means that the user can access the SSRAM even if the scrubbing procedure is in progress. The scrubbing rate, which is the delay between accessing consecutive memory words, can be configured by the user by writing to an internal control register memory 211 in the control unit 202. In the present embodiment the scrubbing rate is a minimum of four clock cycles. i.e. every forth clock cycle the next memory word is scrubbed by the scrubbing module 203. In other embodiments the scrubbing rate may be higher up to the limit that at every clock cycle the next memory word is scrubbed.

If the chip 200 is operated with a clock frequency of 50 MHz, the clock cycle duration is $2\times10^{-8}$ s. In order to scrub all memory blocks 201, it is necessary to read $2^{19}$ addresses corresponding to 524288 addresses. If in the considered embodiment the next memory address is read only after 4 clock cycles corresponding to $8\times10^{-8}$ s, it takes 42 ms to read all 524288 addresses. In other words: The minimum time for scrubbing all the memory words is 42 ms when the working frequency is 50 MHz. If the clock frequency is higher than the minimum time for scrubbing all memory words decreases and vice versa. Similarly, if the next memory word is scrubbed every clock cycle or every second or third clock cycle then the minimum time for scrubbing all memory words decreases as well.

SEU Monitor

The proposed SEU monitor 205 is integrated into the control unit 202 to perform the error counting. The basic function of the control unit 202 is to provide synchronous access to the 16-Mbit SRAM memory blocks 201 and to the internal registers which reside in the control unit. There are several control and status registers which direct the behaviour of the chip 200. The SEU monitor 205 simply piggybacks on the EDAC and scrubbing mechanisms. For the SEU monitor 205 to work, scrubbing must be in operation. When a single, double or permanent fault is detected, one of the three error counters 208', 208'', 208''' is incremented, wherein counter 208' is a single-bit counter, counter 208'' is a double-bit counter, and counter 208''' is a permanent fault counter. If one of the counters 208', 208'', 208''' overflows, it starts counting again from zero, but a corresponding overflow bit is also set in the status register. However, according to empirical expectations based on the event counts from existing space missions, with timely scrubbing and rewrite as well as reset, the SEU monitor 205 guarantees normal operation of the SRAM chip 200 even during large SPE peak fluxes.

A 32-bit to 21-bit address register file stored in a memory 209 is used to log erroneous addresses in order to avoid counting the same errors multiple times. The register file is also used to detect permanent faults. A single 21-bit entry consists of a valid entry bit, a 19-bit address, and an error type bit which differentiates between double-bit error and permanent faults. Up to 32 erroneous addresses can be thus recorded simultaneously. If the register file overflows, the oldest individual record will be automatically discarded, and a corresponding overflow bit will be set in the status register. Moreover, a valid entry bit will be reset if a double-bit error address is rewritten by the user.

Since the permanent faults are logged in the register file it is advantageously possible to detect the permanent faults. The detection function is a unique design, and known SEU monitors do not have the ability to detect permanent faults.

Figure 3:
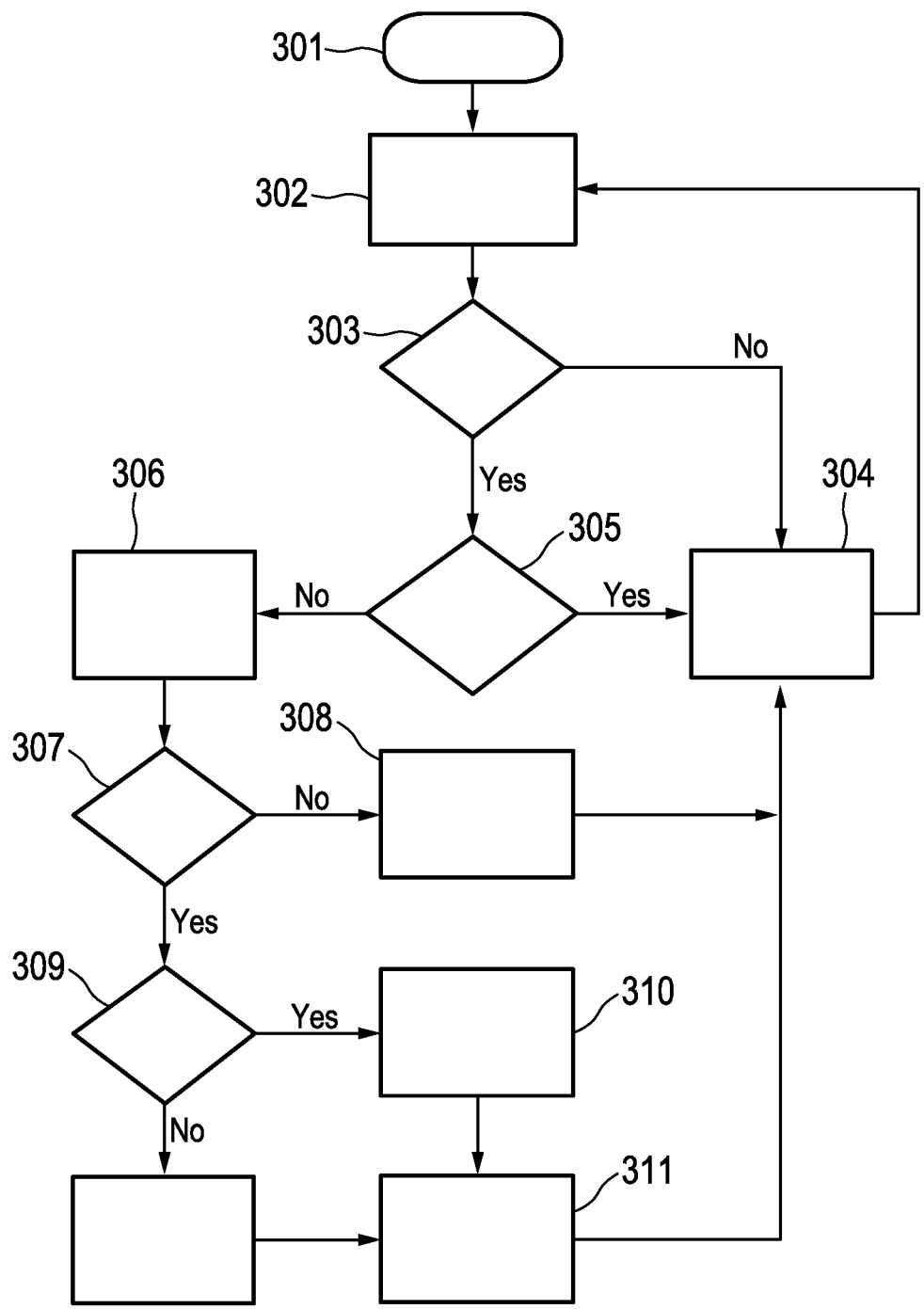
FIG. 3 a schematic flow diagram of a method for monitoring an SEU rate and detecting permanent faults.

The method of detecting the SEU rate is described with reference to FIG. 3 showing a flow diagram of the proposed method.

Upon receipt of a chip idle signal at step 301, the scrubbing procedure starts at step 302 from the ending address of the previous procedure to check each 39-bit memory word comprising a 32-bit data word and its 7-bit syndrome. If in step 303 no errors are detected in the current memory word, the error detection will proceed in step 304 to the next address and execute the scrubbing of the memory word stored at the next memory address (step 302). If, however, in step 303 an error is detected, it is verified in step 305 if the corresponding address has already been logged in the address register file. The address register file contains all addresses where an error has been detected in a memory word. If the corresponding address has already been logged in the address register file, then the scrubbing procedure moves on to the next memory address in step 304 and continues with scrubbing the memory word (step 302) at the next address. If, however, an error is found in step 303 and it is determined in step 305 that the address has not yet been logged in the address register file, then the scrubbing procedure carries on with step 306 for re-scrubbing the memory word at the current address. In step 307 it is checked again if the current memory word contains an error. If no errors are found in step 307, it means that the EDAC has corrected this error, identifying it as a single-bit error. This is a valid conclusion because the EDAC module 204 is only capable of correcting single-bit errors. Hence, if the EDAC module 204 could correct the error it means that a single-bit error was present. In step 308 a single-bit error counter is increased by 1 and the scrubbing procedure moves on to scrub memory word at the next address (steps 304, 302). If, however, an error is still found in step 307, the current memory word contains a double-bit and/or permanent fault(s) that cannot be corrected by the EDAC module 204.

In step 309, the error type, namely whether the error is a double-bit error or a permanent fault, is determined by EDAC module 204 in the rescrubbing procedure of step 306. If no permanent fault is detected, then the detected error or is identified as double-bit error or and a corresponding double-bit error counter is increased in step 310. In step 311 the corresponding error address of the double-bit error is logged in the register file. If in step 309 a permanent fault is detected the corresponding error address of the permanent fault is logged in the register file in step 311. At the same time, the "error type" bit from EDAC module 204 is also appropriately set in the register file in step 311. The error type bit differentiates between double-bit error and permanent faults. After step 311 the scrubbing procedure returns to step 304 and 302, i.e. the memory word at next address is scrubbed.

Since the EDAC module 204 logs in the register file the addresses of double-bit errors and permanent faults which cannot be corrected by the EDAC module 204, the SEU monitor 205 avoids duplicate counting of the same double or permanent faults because in step 305 the scrubbing module 203 does not re-scrub the memory words at the addresses logged in the register file. Consequently, double-bit errors and permanent faults are counted only once, and the corresponding counters do not overflow in practice.

A problem may arise if the SSRAM is constantly accessed by the user without idle cycles between read/write operations. In this situation the entire SSRAM cannot be scrubbed in a timely manner, since the scrubbing operation is designed to be transparent to the user. Consequently, the SEU monitor 205 is not active in such a situation and soft errors due to SEUs may accumulate in the SSRAM overtime. Therefore, one embodiment of the present disclosure implements regularly scrubbing all memory words, e.g. at least once every hour. Of course, other embodiments may select other time intervals. An appropriate time interval may be selected according to the sensitivity of the SSRAM regarding the occurrence of SEUs. By regularly forcing the SEU monitor 205 to become active it is, firstly, avoided that SEUs accumulate in the SSRAM and, secondly, a timely monitoring of the SEUs by reading the error counters enables timely discovering the onset phenomenon of SPE. Specifically, if the counters show an increase of the SER exceeding the usual background level, then this may give an indication of an onset of an SPE phenomenon. The observation of a beginning SPE phenomenon provides the opportunity to adapt the redundancy level of the electronic circuit.

The user can read the SEU counters, the address register file and status registers as well as write and read the control registers at any time. By writing the corresponding bits in the control registers, the user can also reset the SEU counters and all 'valid entry' bits of the address register file. Since the counters and all other registers can also be affected by radiation particles, Triple-Modular Redundant (TMR) flip-flops are used in one embodiment to enhance their robustness against SEUs. Other radiation-hardened designs for implementing the register file and counters may be utilized in other embodiments.

The proposed SEU monitor 205 is suitable to be used as an integral part of a multiprocessor system in order to achieve a dynamic self-adaptive platform which enables an adaptive trade-off between reliability, power consumption and performance.

Figure 4:
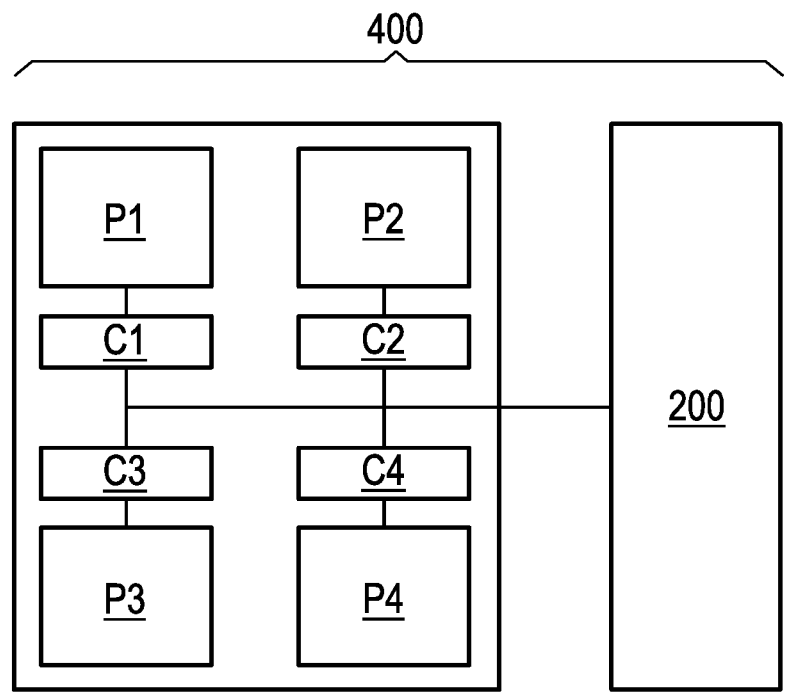
FIG. 4 a schematic block diagram of a multiprocessor system.

Therefore, according to a further aspect the present disclosure proposes a multiprocessor system provided with an SSRAM including the SEU monitor or 205. FIG. 4 shows a schematic block diagram of a multi-processor system 400 having four processors or cores P1-P4. Each processor P1-P4 is communicatively connected with an associated cache memory C1-C4 with the other processors and with the SRAM chip 200. The data communication connections are symbolized by lines 401 between the components.

The proposed multiprocessor system 400 has an inherent hardware redundancy and is convenient for deployment of reconfigurable/dynamic mechanisms, such as core-level N-Module Redundancy (NMR), dynamic task scheduling, adaptive voltage scaling, etc. The proposed SEU monitor 205 is configured to determine the Soft Error Rate (SER) and predict a potential SPE in such a system and provide information to the mechanisms for dynamic reconfigurability and self-adaptation, i.e., determine the optimal operating modes under the premises of reliability. In this sense, the multiprocessor system is self-adaptive.

The reliability requirements of the multiprocessor system are for instance based on the Safety Integrity Level (SIL) defined by the IEC 61508 standard which is commonly referred by the systems with high-reliability requirements such as those in space applications [6]. In this standard, four SILs are proposed, with the SIL 4 as the most dependable and SIL 1 as the least. The relationship between the SERs and the configuration modes under the constraint of SILs can be determined by static analysis. Four reliability tables can be formed to represent the connection between the SERs and operation modes under the reliability requirement of each SIL. The system launches a specific operating mode within a certain SER range, in order to satisfy the SIL demand. Basing on the real-time SER information coming from the proposed SEU monitor 205 and the required SIL from the user and/or tasks requirements, the operating mode can be determined and launched according to these tables. Moreover, the onset of SPE phenomenon can be predicted by evaluating the Mean Time To Upset (MTTU) of the SEU monitor 205. The prediction of the SPE enables the system to respond appropriately in advance, in order to avoid disturbances by the predicted large particle fluxes.

In one specific embodiment the proposed SEU monitor 205 is integrated into a 4-core multiprocessor system. The 4-core multiprocessor system has three operation modes: 1) in de-stress (and power-saving) mode, three of the cores are powered off, while only one core is actively executing instructions; 2) in faulttolerant mode, two, three or all four cores simultaneously execute the same task in a Dual, Triple or Quadruple Modular Redundant (DMR, TMR, or QMR) fashion, respectively, in order to increase the error resilience; 3) in high-performance mode, all cores execute different tasks and act the same as a conventional multiprocessor. The objective of switching between different operating modes is to dynamically improve the reliability or enhance the performance by adjusting the "redundant" and "power off" status of the processing cores. Details on dynamic switching of the operating modes can be found e.g. in [7]. Regarding the transient faults induced by radiation particles, the DMR enables detection of one core error output, TMR can mask one core error, and QMR has the ability to mask up to two core errors simultaneously.

Figure 5:
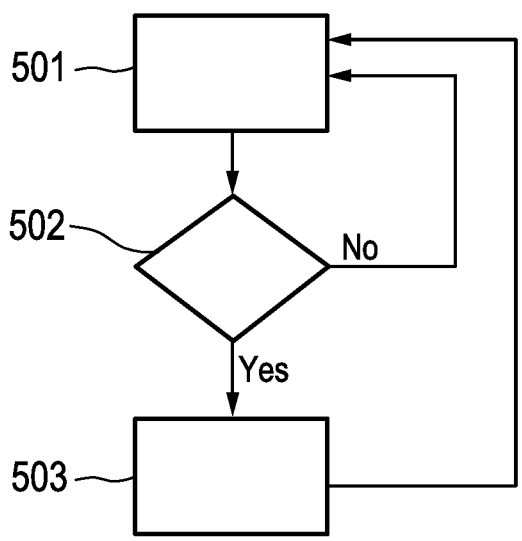
FIG. 5 a schematic flow diagram of a method for adapting the operation mode of a multi-processor system.

A method for automatically adapting the operation mode of the proposed multiprocessor system is schematically illustrated in FIG. 5. The method includes in step 501 reading the register file of the control unit 202. The register file includes information about the number of single- and double-bit errors and permanent faults enabling calculating the SER. In step 502. The method determines the SER. For instance, if the SER remains on a background level then the multiprocessor system 400 is operated in the de-stress or the high-performance mode. If, however, in step 502, the SER exceeds a predetermined threshold, then the multi-processor system is switched into the fault-tolerant mode in step 503. The method then returns to step 501. If the SER has dropped back again to the background level, then the multiprocessor system 400 is switched back to the de-stress or the high-performance mode.

By integrating the proposed SEU monitor 205 into the 4-core multi-processor system, dynamic reconfiguration can be achieved by on-demand NMR formation of the cores in dependence of the radiation conditions. A SER smaller than $10^{-8}$ upsets/bit/day indicates that the radiation status could hardly harm the system, in which case high-performance (or de-stress mode) can be deployed. In times of large particle fluxes, the fault-tolerance mode can be determined based on the real-time SER value. Moreover, if the predicted SPE shows a high occurrence probability, the TMR or QMR mode can be activated in advance.

Apparently, the present disclosure is applicable also to multiprocessor systems having fewer or more than four cores.

In the claims, the words "comprise" and "include" do not exclude other elements or steps, and the undefined article "a" does not exclude a plurality.

A single unit or device may perform the functions of several elements set forth in the claims. The fact that individual functions and elements are listed in different dependent claims does not mean that a combination of these functions and elements could not be used advantageously.

CITED LITERATURE

[1] R. Glein et al. "BRAM implementation of a single event upset sends or for adaptive single event effect mitigation in the reconfigurable FPGAs", 2017 NASA/ESA conference on adaptive hardware and systems (AHS), Pasadena, Calif., 2017, pp 1-8.

[2] J. Barak et al. "Detecting heavy ions and protons in space: single-events monitor", Eighteenthe Convention of Electrical and Electronics Engineers in Israel, Tel Aviv, 1995, pp. 5.5.1/1-5.5.1/3.

[3] G. Tsiligiannis et al. "An SRAM Based Monitor for Mixed-Field Radiation Environ-ments", in IEEE Transactions on Nuclear Science, vol. 61, no. 4, Aug. 2014, pp. 1663-1670.

[4] Prinzie et al. "An SRAM Based Radiation Monitor with Dynamic Voltage Control in 0.18 um CMOS technology", Topical Workshop on Electronics for Particle Physics, 2018.

[5] M. Y. Hsiao, "A Class of Optimal Minimum Odd-weight-column SECDED Codes" in IBM Journal of Research and Develeopment, vol. 14, no. 4, July 1970, pp. 395-401.

[6] Functional Safety of electrical/electronic/programmable electronic safety related systems (IEC 61508), International Electrotechnical Commission, 2005.

[7] A. Simevski, R. Kraemer and M. Krstic, "Investigating Core-Level N-Modular Redundancy in Multiprocessors," 2014 IEEE 8th International Symposium on Embedded Multicore/Manycore SoCs, Aizu-Wakamatsu, 2014, pp. 175-180.

The invention claimed is:

1. An electronic circuit comprising an SRAM memory, a control unit, an error detection and correction module and a scrubbing module, wherein the electronic circuit further comprises an SEU monitor sharing SRAM cells with the SRAM memory, wherein:
the control unit is provided with at least three counters for counting different types of errors, the errors comprising single bit errors, double bit errors, and permanent faults;
the control unit comprises a register file storing addresses of double bit errors and permanent faults to avoid double counting of already detected errors;
the SEU monitor is configured to determine a soft error rate and to provide information for reconfiguring a connected system to adapt operating modes of the connected system in response to the determined soft error rate; and
the SEU monitor is integrated with the SRAM cells such that operation of the SRAM memory as a storage element is not affected.

2. The electronic circuit according to claim 1, wherein the control unit comprises a control register containing user selectable control parameters determining an operation mode of the electronic circuit.

3. The electronic circuit according to claim 1, wherein the error detection and correction module is configured to correct single-bit errors and to detect double-bit errors.

4. The electronic circuit according to claim 1, wherein the error detection and correction module is configured to correct single-bit errors and to detect double-bit errors in one or more memory words.

5. The electronic circuit according to claim 1, wherein the at least three counters and a memory for the register file are implemented in a radiation-hardened design.

6. The electronic circuit according to claim 1, wherein the scrubbing module is configured to drive the SEU monitor.

7. The electronic circuit according to claim 1, wherein the scrubbing module is configured to allow a user to configure a scrubbing rate.

* * * * *